US011334517B1

(12) United States Patent
Chang et al.

(10) Patent No.: US 11,334,517 B1
(45) Date of Patent: May 17, 2022

(54) ELECTRONIC DEVICE FOR HOT PLUGGING DETECTION

(71) Applicant: Wiwynn Corporation, New Taipei (TW)

(72) Inventors: Wei-Fang Chang, New Taipei (TW); Yu-Chun Chen, New Taipei (TW); Pei-Zhen Tsai, New Taipei (TW); Chung-Hui Yen, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 17/128,217

(22) Filed: Dec. 21, 2020

(30) Foreign Application Priority Data

Oct. 28, 2020 (TW) .................................. 109137354

(51) Int. Cl.
*G06F 13/42* (2006.01)
*G06F 13/40* (2006.01)
*H01R 13/627* (2006.01)
*H05K 5/02* (2006.01)
*H01R 12/73* (2011.01)
*G06F 13/16* (2006.01)

(52) U.S. Cl.
CPC ...... *G06F 13/4282* (2013.01); *G06F 13/1668* (2013.01); *G06F 13/4068* (2013.01); *H01R 12/73* (2013.01); *H01R 13/6271* (2013.01); *H05K 5/0286* (2013.01)

(58) Field of Classification Search
CPC .......................... G06F 13/4282; G06F 13/4068
See application file for complete search history.

(56) References Cited

U.S. PATENT DOCUMENTS

| | | | |
|---|---|---|---|
| 10,082,842 | B1 | 9/2018 | Looi |
| 10,534,409 | B2 | 1/2020 | Looi |
| 2014/0160664 | A1 | 6/2014 | Yang |
| 2019/0056769 | A1 | 2/2019 | Looi |
| 2019/0235589 | A1* | 8/2019 | Murillo .................. G06F 1/266 |
| 2020/0229306 | A1 | 7/2020 | Dey |

FOREIGN PATENT DOCUMENTS

| | | |
|---|---|---|
| TW | 201426335 | 7/2014 |
| TW | 202030570 | 8/2020 |

OTHER PUBLICATIONS

"Office Action of Taiwan Counterpart Application", dated Jun. 23, 2021, p. 1-p. 7.

* cited by examiner

*Primary Examiner* — David E Martinez
(74) *Attorney, Agent, or Firm* — JCIPRNET

(57) ABSTRACT

An electronic device is provided. The electronic device includes a board, a first latch mechanism, and an expansion card. A controller is disposed on the board. The first latch mechanism is disposed on the board. The first latch mechanism is electrically connected to the controller. The expansion card is plugged in the first latch mechanism and disposed over the board. The expansion card is electrically connected to the controller through the first latch mechanism. The controller determines a connecting condition of the first latch mechanism according to a connecting signal provided by the expansion card.

11 Claims, 4 Drawing Sheets

ELECTRONIC DEVICE FOR HOT PLUGGING DETECTION

CROSS-REFERENCE TO RELATED APPLICATION

This application claims the priority benefit of Taiwan application serial no. 109137354, filed on Oct. 28, 2020. The entirety of the above-mentioned patent application is hereby incorporated by reference herein and made a part of this specification.

BACKGROUND

1. Technical Field

The disclosure relates to a device, and particularly relates to an electronic device.

2. Description of Related Art

In the existing electronic device, when an expansion card is plugged in the electronic device and connected to the electronic device through the M.2 transmission specification, the electronic device cannot determine the connecting condition of the expansion card due to the hardware limitation of the M.2 transmission specification. As a result, some functions cannot be supported by the electronic.

SUMMARY

The disclosure provides an electronic device, which can determine the connecting condition of whether an expansion card is plugged in the electronic device.

The disclosure includes a board, a first latch mechanism and an expansion card. A board is provided with a controller on the board. A first latch mechanism is disposed on the board, and the first latch mechanism is electrically connected to the controller. An expansion card is plugged in the first latch mechanism and disposed over the board, and the expansion card is electrically connected to the controller through the first latch mechanism. The controller determines the connecting condition of the first latch mechanism according to a connection signal provided by the expansion card.

Based on the above, the expansion card can provide a connection signal to the controller through the first latch mechanism, such that the controller can determine the connecting condition of the expansion card accordingly. Therefore, the functions of the electronic device can be effectively improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
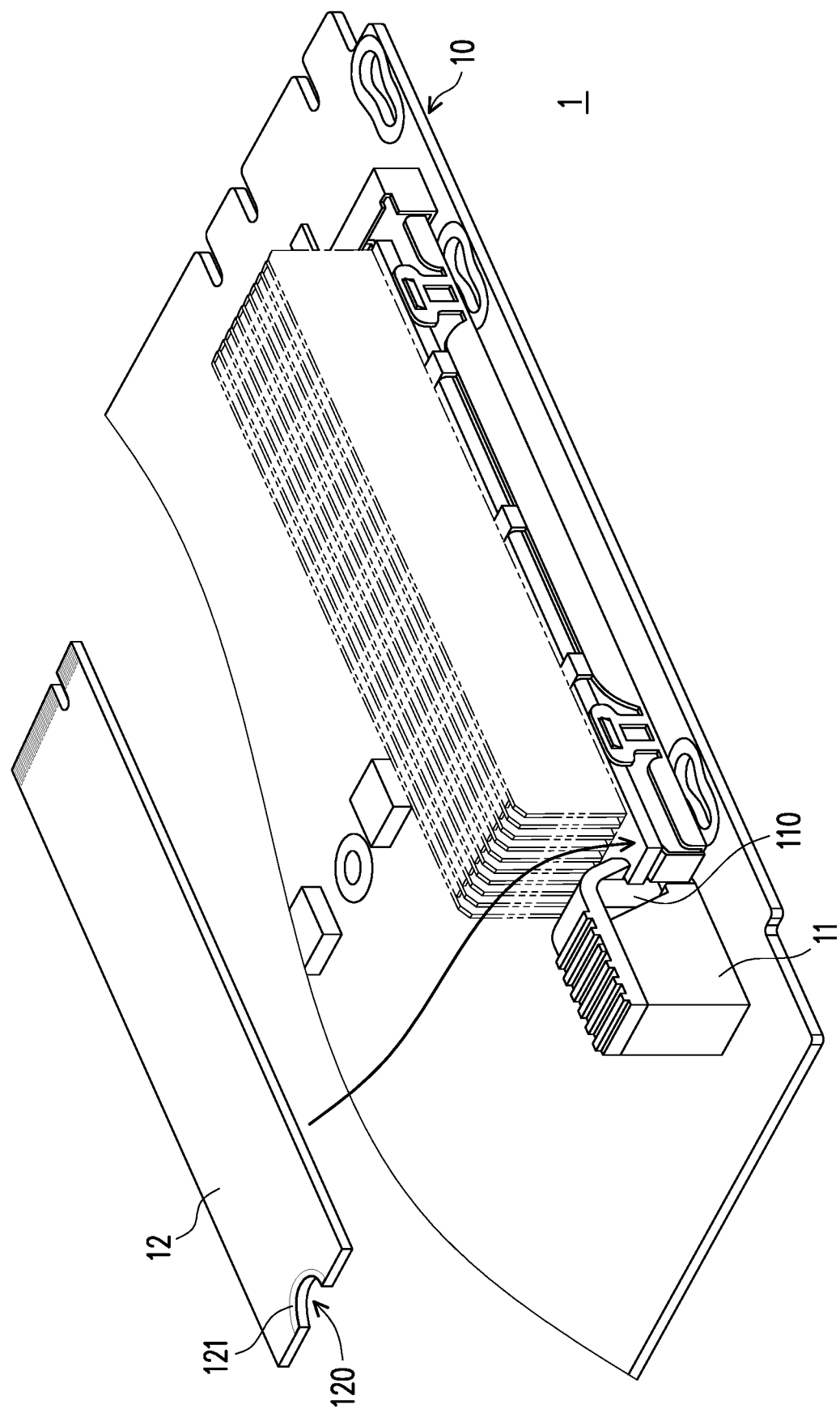
FIG. 1 is a schematic diagram of an electronic device according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

FIG. 1 is a schematic diagram of an electronic device 1 according to an embodiment of the disclosure. The electronic device 1 includes a board 10, a latch mechanism 11, and an expansion card 12. Although not shown in FIG. 1, a controller and electrical traces are provided on the board 10. The controller is electrically connected to the electrical traces, and through the electrical traces, the controller may the detect signal. The latch mechanism 11 is disposed on the board 10, and the latch mechanism 11 is electrically connected to the electrical traces on the board. In this way, the controller and the latch mechanism 11 may be electrically connected to each other through the electrical traces of the board 10. The expansion card 12 is plugged in the latch mechanism 11 and disposed over the board 10, and the expansion card 12 is electrically connected to the controller through the latch mechanism 11. Thus, when the expansion card 12 is plugged in the latch mechanism 11, the expansion 12 may provide a connection signal to the controller through the latch mechanism 11; the controller can determine the connecting condition of the latch mechanism 11 according to the connection signal provided by the expansion card 12. In other words, according to the connection signal, the controller can determine whether the expansion card 12 is correctly plugged in the latch mechanism 11. In some embodiments, the controller may support a hot plugging function of the expansion card 12 according to the connection signal.

In detail, the board 10 may be a printed circuit board (PCB), and has a single-layer or multi-layer structure. The board 10 may be configured to dispose electronic components thereon and to provide graphical electrical traces such that the electronic components disposed on the board 10 may perform preset functions or operations.

The controller disposed on the board 10 may be a central processing unit (CPU), or other programmable general-purpose or special-purpose micro control unit (MCU), microprocessor, digital signal processor (DSP), programmable controller, application specific integrated circuit (ASIC), graphics processing unit (GPU), arithmetic logic unit, ALU), complex programmable logic device (CPLD), field programmable gate array (FPGA), or other similar components or a combination of the above components. Alternatively, the controller 10 may be a hardware circuit, designed through hardware description language (HDL) or any other digital circuit design method well known to those with ordinary knowledge in the art, and implemented by field programmable gate array (FPGA), complex programmable logic device (CPLD), or application specific integrated circuit (ASIC).

The latch mechanism 11 may be a board connector, and may be provided with a latch fixing mechanism thereon. The latch mechanism 11 may be disposed on the board 10 in various ways. The latch mechanism 11 is in contact with the electrical traces on the board 10, and then is electrically connected to the controller. For example, the latch mechanism 11 may be connected to the board 10 through a direct-attach connector, a direct soldering connector, or the like, or suitable connection methods.

The expansion card 12 is plugged in the latch mechanism 11. In detail, the latch mechanism 11 may have a cylindrical columnar structure 110 for fixing the expansion card 12. One end of the expansion card 12 plugged in the latch mechanism 11 may have an arc-shaped inner recess 120, which corresponds to a columnar structure 110 of the latch mechanism 11. The latch mechanism 11 and the expansion card 12 may be structured correspondingly, such that when the expansion card 12 is plugged in the latch mechanism 11, the inner recess 120 may be fixed by the columnar structure 110, such that the expansion card 12 is disposed over the board 10. Further, the arc-shaped inner recess of the expansion card 12 may be provided with a metal contact portion 121 at a periphery thereof, such that when the expansion card 12 is plugged in the latch mechanism 11, the metal contact portion 121 may be in contact with and electrically connected to the latch mechanism 11. Although not shown in FIG. 1, the latch mechanism 11 also includes a wire structure inside, and is electrically connected to the electrical traces on the board 10. In this way, the expansion card 12 may provide the connection signal through the metal contact portion 121, and the controller may receive the connection signal provided by the expansion card 12 through the disposition of the latch mechanism 11.

On the other hand, the expansion card 12 may be provided with a connection port or gold finger on the other side of the arc-shaped inner recess, and, with the connection port or gold finger, the expansion card 12 may transmit the signal to the controller or the electronic components on the board 10, and obtain a reference voltage (for example, a ground voltage). In one embodiment, the expansion card 12 may perform signal transmission through the M.2 specification. The expansion card 12 may provide one of the reference voltages (for example, the ground voltage) obtained through the connection port or the gold finger to the electrical traces at the periphery of the inner recess of the expansion card 12, so as to use the reference voltage (for example, the ground voltage) as a connection signal. Thus, when the expansion card 12 is plugged over the board 10, the controller may receive the connection signal provided by the expansion card 12 through the electrical connection of the expansion card 12, the latch mechanism 11, and the board 10. Accordingly, the controller can determine that the expansion card 12 is plugged in the latch mechanism 11. When the controller does not receive the connection signal, the controller can determine that the expansion card 12 is not plugged in the latch mechanism 11, or that the expansion card 12 is not correctly plugged in the latch mechanism 11. Therefore, the controller can determine the connecting condition of the latch mechanism 11 by whether the reference voltage (for example, the ground voltage) provided by the expansion card 12 is received, and then gets to know whether the expansion card 12 is plugged in the latch mechanism 11. In one embodiment, the connection signal provided by the expansion card 12 is the ground voltage provided by the controller to the expansion card 12 through the connection port of the other side. Therefore, when the expansion card 12 is correctly plugged in the latch mechanism 11, the controller can receive the ground voltage through a loop formed by the latch mechanism 11, the expansion card 12, and the connection port of the expansion card 12. Conversely, when the expansion card 12 is correctly plugged in the latch mechanism 11, the controller cannot form the loop by the latch mechanism 11, the expansion card 12, and the connection port of the expansion card 12, and cannot receive the ground voltage. Therefore, the controller can determine the connecting condition on the latch mechanism 11 accordingly.

For example, the expansion card 12 may be, for example, an external storage device or a solid-state disk (SSD). The expansion card 12 may perform signal transmission in compliance with an M.2 specification of the expansion card. The electronic device 1 may realize the function of a present pin through the electrical connection between the expansion card 12, the latch mechanism 11 and the controller. In one embodiment, when the electronic device 1 determines that a failure has occurred and cannot access the expansion card 12, based on the connection signal, the controller can determine whether the access failure is due to hardware damage, or that the access failure is due to the expansion card 12 being incorrectly plugged in the latch mechanism, thereby effectively eliminating the failure. In another embodiment, since the electronic device 1 can determine the connecting condition of the expansion card 12 on the latch mechanism 11 based on the connection signal, the electronic device 1 can determine the connecting condition of the expansion card 12 accordingly, and thus can support hot plugging function of the expansion card 12. In yet another embodiment, the controller in the electronic device 1 can determine the connecting condition of the expansion card 12 according to the connection signal, and then execute the power sequence on the expansion card 12 accordingly.

Therefore, the controller in the electronic device 1 may be electrically connected to the expansion card 12 through the latch mechanism 11. The controller can determine the connecting condition of the latch mechanism 11 according to whether the connection signal provided by the expansion card 12 is received. In this way, for the expansion board 12 which conforms to the M.2 specification of the expansion card in the electronic device 1, the electronic device 1 supports or provides the hot plugging function of the expansion board 12. Thus, the electronic device 1 can provide an electronic device to determine the connecting condition of the expansion card 12, using existing hardware device without requiring additional hardware settings, thereby saving the manufacturing cost of the electronic device 1 while improving the functions of the electronic device 1.

Figure 2A:
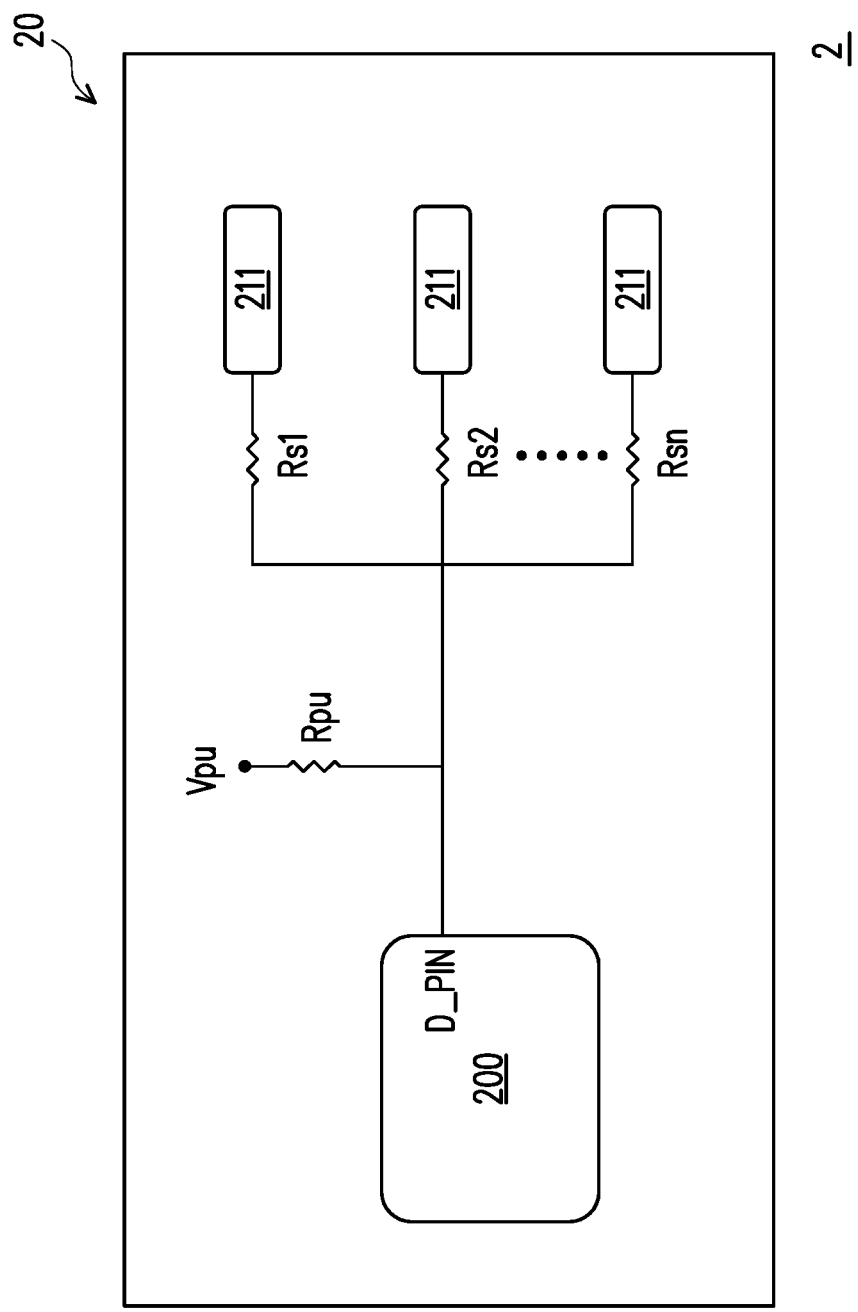
FIG. 2A is a block schematic diagram of an electronic device according to an embodiment of the disclosure.

FIG. 2A is a block diagram of an electronic device 2 according to an embodiment of the disclosure. The electronic device 2 includes a board 20, a controller 200, a pull-up resistor Rpu, pull-down resistors Rs1-Rsn, and latch mechanisms 211-21$n$; the controller 200, the pull-up resistor Rpu, the pull-down resistors Rs1-Rsn, and the latch mechanisms 211-21$n$ are provided on the board 20. In this embodiment, the controller 200 of the electronic device 2 may connect a single pin D_PIN to the latch mechanisms 211-21$n$ at the same time, and receive the connection signals through the pin D_PIN, thereby determining whether an expansion card is plugged in each of the latch mechanisms 211-21$n$.

In detail, in the electronic device 2, one ends of the pull-down resistors Rs1-Rsn are coupled to the pin D_PIN of the controller 200, and the other ends of the pull-down resistors Rs1-Rsn are coupled to the corresponding latch mechanisms 211-21$n$. In addition, the pin D_PIN of the controller 200 is also coupled to one end of the pull-up resistor Rpu, and the other end of the pull-up resistor Rpu receives the pull-up voltage Vpu.

In an embodiment, the number n of the latch mechanisms and the pull-down resistors that are disposed in the electronic device 2 may be three, and the resistance values of the pull-up resistor Rpu and the pull-down resistors Rs1-Rs3 may be 1.24 kiloohms (KΩ), 5.11 kiloohms (KΩ), 10 kiloohms (KΩ), and 18.7 kiloohms (KΩ), respectively. Thus, through the arrangement of the resistance values of the pull-up resistor Rpu and the pull-down resistors Rs1-Rs3, when the expansion card is plugged in different latch mechanisms 211-213, the reference voltage provided by the expansion card can generate different voltage offsets for the voltage levels received by the pin D_PIN. Therefore, the controller 200 can determine the voltage level of the connection signal received by the pin D_PIN by setting an analog-to-digital converter (ADC) on the pin D_PIN. Therefore, the electronic device 2 can determine the connecting condition of each of the latch mechanisms 211-213 through the pin D_PIN.

Figure 2B:
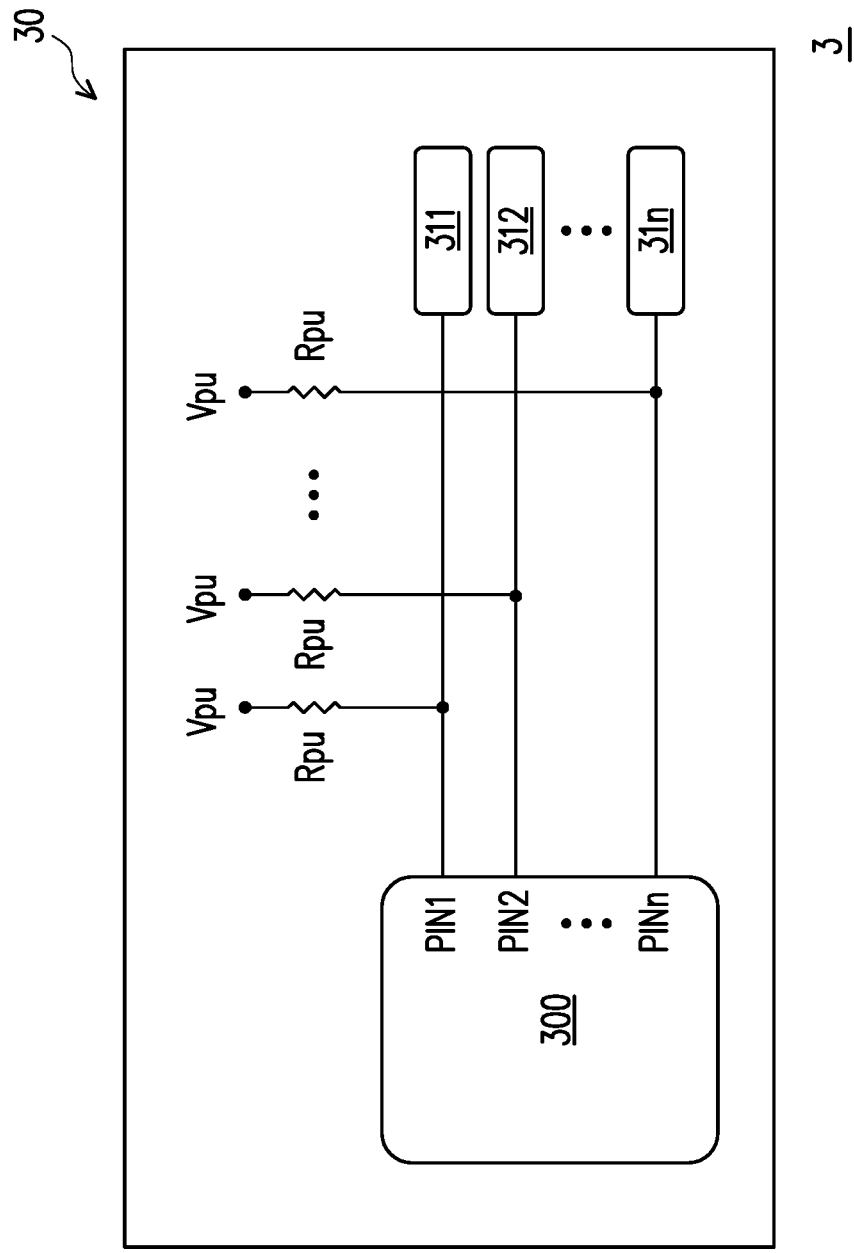
FIG. 2B is a block schematic diagram of an electronic device according to an embodiment of the disclosure.

FIG. 2B is a block diagram of an electronic device 3 according to an embodiment of the disclosure. The electronic device 3 includes a board 30, a controller 300, multiple pull-up resistors Rpu, multiple latch mechanisms 311-31n; the controller 300, the pull-up resistors Rpu, and the latch mechanisms 311-31n are provided on the board 30. In this embodiment, the controller 300 of the electronic device 3 includes pins PIN1-PINn, and the pins PIN1-PINn are respectively connected to the latch mechanisms 311-31n so as to receive the connection signal of each of the latch mechanisms 311-31n. Accordingly, the electronic device 3 can determine the connecting condition of each of the latch mechanisms 311-31n.

In detail, in addition to being connected to the corresponding latch mechanisms 311-31n, each of the pins PIN1-PINn of the controller 300 is also connected to a pull-up resistor Rpu, and the other end of the pull-up resistor Rpu can receive the pull-up voltage Vpu. In this way, when each of the latch mechanisms 311-31n is provided with the expansion card, the expansion card may provide the connection signals to the pins PIN1-PINn through the corresponding latch mechanisms 311-31n, and the controller 300 can determine the connecting condition of each of the latch mechanisms 311-31n according to the connection signal received by each of the pins PIN1-PINn. In one embodiment, the connection signal provided by the expansion card is the ground voltage. Therefore, when the expansion card is plugged in the latch mechanism 312, the reference voltage provided by the expansion card can change the voltage level on the pin PIN2 that corresponds to the latch mechanism 312. When the controller 300 determines that the voltage level on the pin PIN2 is smaller than the preset voltage level, the controller 300 can determine, accordingly, that the latch mechanism 312 corresponding to the pin PIN2 is plugged with an expansion card and determine the connecting condition of the latch mechanism 312. Therefore, the controller 300 can determine the connecting condition of each of the latch mechanisms 311-31n according to the voltage level received by each of the pins PIN1-PINn.

Figure 2C:
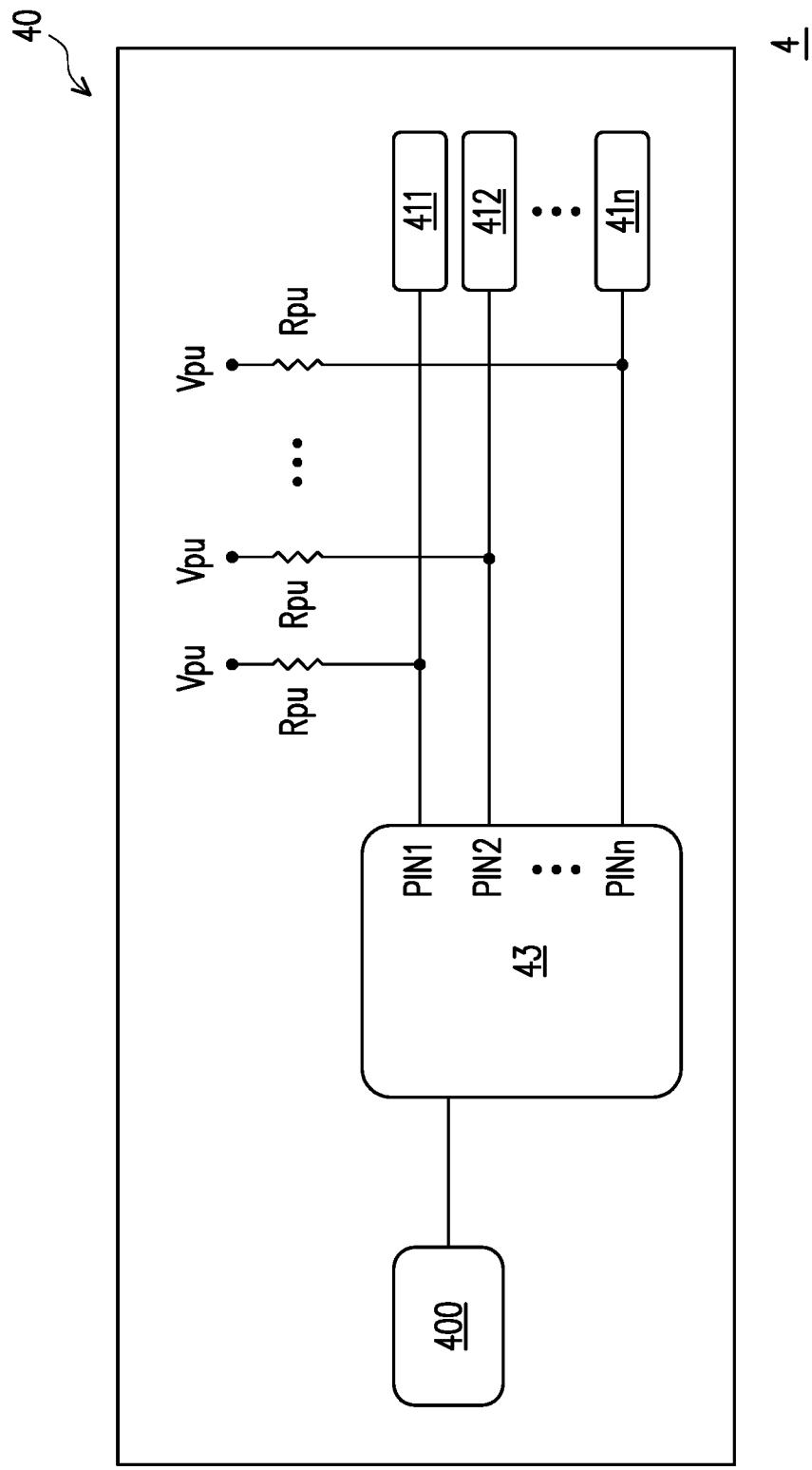
FIG. 2C is a block schematic diagram of an electronic device according to an embodiment of the disclosure.

FIG. 2C is a block diagram of an electronic device 4 according to an embodiment of the disclosure. The electronic device 4 includes a board 40, a controller 400, multiple pull-up resistors Rpu, multiple latch mechanisms 411-41n, and an expansion connector 43; the controller 400, the pull-up resistors Rpu, the latch mechanisms 311-31n, and the expansion connector 43 are provided on the board 40. The expansion connector 43 of the electronic device 4 includes the pins PIN1-PINn, and the pins PIN1-PINn are respectively connected to the latch mechanisms 411-41n so as to receive corresponding connection signals. The expansion connector 43 is also coupled to the controller 400 so as to provide the received connection signals to the controller 400. Accordingly, the controller 400 of the electronic device 4 can determine the connecting condition of each of the latch mechanisms 411-41n according to the connection signal received by the expansion connector 43.

In detail, each of the pins PIN1-PINn of the expansion connector 43 may be connected to a corresponding one of the latch mechanisms 411-41n. In addition, each of the pins PIN1-PINn is also connected to a pull-up resistor Rpu, and the other end of each pull-up resistor Rpu may receive the pull-up voltage Vpu. In this way, when the expansion card is plugged in any one of the latch mechanisms 411-41n, any one of the corresponding pins PIN1-PINn can receive the connection signal. Furthermore, the expansion connector 43 may provide the connection signal information received by the pins PIN1-PINn to the controller 400, such that the controller 400 can determine the connecting condition of each of the latch mechanisms 411-41n.

In an embodiment, the pins PIN1-PINn of the expansion connector 43 may be general-purpose input/output (GPIO) pins. In other words, the expansion connector 43 and the plugged expansion card may be communicatively connected and communicated with each other through a general input/output transmission format. The pins between the expansion connector 43 and the controller 400 may be inter-integrated circuit (I²C) pins. In other words, the expansion connector 43 and the controller 400 may be communicatively connected and communicated with each other through the transmission format of the inter-integrated circuit. In this way, by connecting the expansion connector 43 to the controller 400 and the latch mechanisms 411-41n and appropriately converting the transmission format, the controller 400 can determine the connecting condition of each of the latch mechanisms 411-41n through a single pin.

In summary, in the electronic device of the disclosure, the expansion card may provide a connection signal to the controller through the latch mechanism, such that the electronic device can determine the connecting condition of the expansion card plugged in the latch mechanism. Furthermore, the connecting condition can be used to efficiently troubleshoot the electronic device. Alternatively, the connecting condition can be used by the electronic device to support the hot-plug function of the expansion card. Or, the connecting condition can be used as a basis for performing the power sequence of the expansion card. In this way, the functions of the electronic device can be effectively improved.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An electronic device, comprising:
a board, a controller disposed on the board;
a first latch mechanism disposed on the board, the first latch mechanism electrically connected to the controller;
a connection socket, disposed on the board; and
an expansion card having one side plugged in the first latch mechanism and another side inserted in the connection socket,
wherein the controller determines a connecting condition of the first latch mechanism according to a connection signal generated by a loop formed by the first latch mechanism, the expansion card, and the connection socket.

2. The electronic device according to claim 1, wherein the expansion card complies with an M.2 specification of the expansion card and performs a signal transmission.

3. The electronic device according to claim 1, wherein the electronic device supports a hot plugging function of the expansion card.

4. The electronic device according to claim 1, wherein the connection signal is a reference voltage, and the controller determines the connecting condition of the first latch mechanism according to whether the reference voltage is received.

5. The electronic device according to claim 1, further comprising:
a pull-up resistor comprising a first end and a second end, wherein the first end of the pull-up resistor receives a pull-up voltage;
a first pull-down resistor comprising a first end and a second end, wherein the first end of the first pull-down resistor is coupled to the second end of the pull-up resistor, and the second end of the first pull-down resistor is coupled to the first latch mechanism;
a second pull-down resistor comprising a first end and a second end, wherein the first end of the second pull-down resistor is coupled to the second end of the pull-up resistor; and
a second latch mechanism, coupled to the second end of the second pull-down resistor.

6. The electronic device according to claim 5, wherein the controller is coupled to the second end of the pull-up resistor so as to receive the connection signal, and the controller recognizes the connecting condition of each of the first latch mechanism and the second latch mechanism by determining a voltage level of the connection signal.

7. The electronic device according to claim 1, further comprising:
a first pull-up resistor comprising a first end and a second end, wherein the first end of the first pull-up resistor receives a pull-up voltage, and the second end of the first pull-up resistor is coupled to the first latch mechanism;
a second pull-up resistor comprising a first end and a second end, wherein the first end of the second pull-up resistor receives the pull-up voltage; and
a second latch mechanism, coupled to the second end of the second pull-up resistor,
wherein the controller comprises a first pin and a second pin, respectively connected to the first latch mechanism and the second latch mechanism.

8. The electronic device according to claim 7, wherein the controller determines the connecting condition of each of the first latch mechanism and the second latch mechanism according to voltage levels of the first pin and the second pin.

9. The electronic device according to claim 1, further comprising:
a first pull-up resistor comprising a first end and a second end, wherein the first end of the first pull-up resistor receives a pull-up voltage, and the second end of the first pull-up resistor is coupled to the first latch mechanism;
a second pull-up resistor comprising a first end and a second end, wherein the first end of the second pull-up resistor receives the pull-up voltage;
a second latch mechanism, coupled to the second end of the second pull-up resistor; and
an expansion connector comprising a first pin, a second pin, and a third pin, wherein the first pin is connected to the controller, the second pin is connected to the first latch mechanism, and the third pin is connected to the second latch mechanism,
wherein the controller is communicatively connected to the first latch mechanism and the second latch mechanism through the expansion connector.

10. The electronic device according to claim 9, wherein the controller determines the connecting condition of each of the first latch mechanism and the second latch mechanism according to voltage levels of the second pin and the third pin.

11. The electronic device according to claim 10, wherein the controller is communicatively connected to the expansion connector through an inter-integrated circuit bus ($I^2C$) format, and the expansion connector is connected to the first latch and the second latch through a general-purpose input/output (GPIO) format.

* * * * *